July 26, 1960 G. B. FINN, JR 2,946,935

DIODE

Filed Oct. 27, 1958

INVENTOR.

GEORGE B. FINN, Jr.

BY

Mason, Kolehmainen, Rathburn and Wyss.

ATTORNEYS 2,946,935

DIODE

George B. Finn, Jr., Bloomington, Ind., assignor to Sarkes Tarzian, Inc., Bloomington, Ind., a corporation of Indiana Filed Oct. 27, 1958, Ser. No. 769,636

10 Claims. (Cl. 317—234)

The present invention relates to diodes and it more particularly relates to housings for power rectifiers of the semiconductor type which include relatively fragile rectifying wafers which must be protected both from the atmosphere and from mechanical shock and vibration.

Germanium or silicon wafers as used in junction semiconductor diodes are necessarily very thin to maintain the carrier lifetimes within usable limits, and since the forward resistance of the diode is inversely proportional to the cross-sectional area of the wafers, it is desirable that such areas be relatively large. Accordingly, the wafers are preferably large in cross-section and small in thickness and thus extremely fragile. By way of example, in some power rectifiers, circular wafers having a thickness of .008 inch and a diameter of over one inch are employed. Such wafers must, therefore, be protected against mechanical shocks and vibration which might be transmitted thereto through the terminal leads which connect them to heat sinks and external electric circuits. Various housing arrangements have been used in the past to provide this necessary protection, and they have primarily relied upon resilient or sliding connections between the terminals and the semiconductor wafers. While such housings have enabled the provision of satisfactory diodes they have not been altogether satisfactory because of the moving parts which they require. A moisture-tight seal is necessary in semiconductor diodes to prevent the establishment of surface leakage paths across the junction, and the provision of the required seals is complicated by the resilient or sliding connections to the wafer.

Therefore, an object of the present invention is to provide a new and improved diode construction which obviates the need for resilient or sliding connections to the rectifier cell.

Another object of the present invention is to provide a new and improved housing for a fragile semiconductor member.

A further object of the present invention is to provide a new and improved rectifier housing for protecting a semiconductor member from mechanical shock and for sealing it from the ambient.

Another object of the present invention is to provide a new and improved junction diode and a method of making it.

Briefly, the above and further objects are realized in accordance with the present invention by providing a junction diode in which the semiconductor wafer is preloaded with a compressive stress during assembly of the diode and the wafer is maintained in compression by the diode housing. The terminal leads are connected to opposite sides of the wafer on the axis of compression thereof and inasmuch as the preload compressive stress exceeds the tensile stress exerted on the leads during normal use of the diode, flexing of the crystal and the consequent breakage thereof is avoided.

The invention, both as to its organization and method of operation, together with further objects and advantages thereof, will best be understood by reference to the following detailed description taken in connection with the accompanying drawings, in which.

Figure 1:
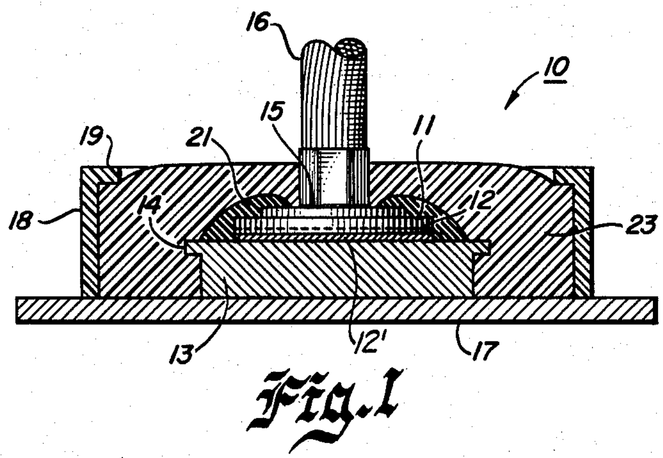
Fig. 1 is a cross-sectional view of a rectifier embodying the present invention.

Referring now to the drawings and particularly to Fig. 1 thereof there is shown a power rectifier 10 which comprises a cylindrical silicon wafer 11 having a PN junction 12 interposed between its top and bottom faces. The junction 12 extends throughout the entire cross-sectional area of the wafer and thus intersects the edge of the wafer 11 throughout a complete circle. The junction 12 is formed in an alloying process in which the bottom portion of an N-type silicon crystal is rendered P-type. The wafer 11, which thus constitutes the rectifying cell portion of the rectifier 10, is ohmically connected to and supported on a generally cylindrical transition member 12' which is connected to and supported on a terminal 13. The terminal 13 includes an outwardly extending annular flange 14 at the upper surface thereof which as more fully described hereinafter is used in preloading the wafer 11. A transition member 15, which is formed of a suitable metal such as tantalum or molybdenum, is bonded to the upper or base side of the wafer 11 and a suitable lead 16 of stranded wire is soldered thereto. The terminal 13 is proferably formed of copper and is welded to a conductive base plate 17 to which a switch and insulating sleeve 18 is bonded. The sleeve 18 may be constituted by an epoxy resin and includes a re-entrant annular flange 19 at the upper end thereof. Where the PN junction 12 is formed in the wafer 11 by an alloying process such, for example, as that disclosed in copending application Serial No. 570,577, filed March 9, 1956, and assigned to the same assignee as the present invention, it will be understood that some of the alloying material and tin will be interposed between the transition member 12' and the wafer 11.

In order to seal the exposed edges of the PN junction 12 from the ambient atmosphere, a resilient gasket 21 formed of a suitable material such as silicon rubber, encloses the exposed surfaces of the crystal 11. In making the rectifier 10, the gasket 21 while in the soft uncured state is troweled onto the side edges and top of the wafer 11 to form a semi-doughnut shaped resilient member which extends from the transition member 15 to the terminal 13. It will be noted that the transition member 15 is centrally positioned on the wafer 11 and that the annular center portion of the transition member 15 which surrounds the adjoining lead 16 is not covered by the gasket 21 but is left exposed. The gasket 21 is thereafter cured and becomes resilient.

In order to compress the gasket 21 against the transition member 15 and against the terminal 13 so as to provide a pressure-tight seal to prevent the leakage of the atmosphere or liquids into the wafer 11 either along the lead 16 or along the plate 17 or sleeve 18, a plastic material 23, such, for example, as a thermosetting expoxy resin, is placed in the soft, uncured state within the sleeve 18 and is thereafter cured. As the resin 23 is cured it contracts thereby to exert a compressive force between the central annular portion of the transition member 15 surrounding the lead 16 and the annular lower surface of the flange 14. The plastic 23 should be impervious to liquids and gases, and must be rigid and of such a nature as to contract during the curing process thereby to compress the gasket 21 against the adjoining surfaces of the transition member 15 and the terminal 13. Moreover, the contraction of the plastic 23 presses the transition member 15 toward the terminal 13 thereby to apply the required compressive preload stress to the silicon wafer 11. By properly dimensioning the components of the rectifier 10, the preload stress which is exerted on the silicon wafer 11 is made greater than the tensile forces which might be exerted between the terminal lead 16 and the plate 17 during normal use of the rectifier. Accordingly, flexing of the wafer 11 by the application of tensile stresses between the terminals 16 and 17 is prevented. In the absence of the preload, such stresses would tend to pull the transition member 15 away from the wafer 11 and the wafer 11 away from the transition member 12′ which might crack the fragile wafer. Consequently, by preloading the wafer 11 in accordance with the present invention, the necessity for providing a resilient connection between one of the terminals and the wafer 11 or of providing a sliding contact between the wafer 11 and either or both of the terminal members is obviated, thus enabling the provision of a rectifier which may be manufactured at a lower cost and which has a small overall size in relation to its current carrying capacity.

Figure 2:
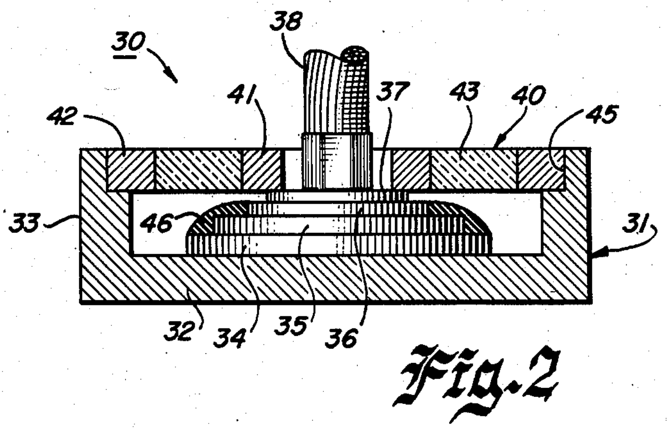
Fig. 2 is a cross-sectional view of another rectifier embodying the present invention.

Referring now to Fig. 2, there is shown a rectifier 30 embodying that aspect of the present invention wherein the semiconductor wafer is preloaded so as to enable the direct connection of terminal leads to the semiconductor wafer. As shown, the rectifier 30 comprises a cup-shaped housing member 31 having a circular bottom portion 32 and an upstanding annular side portion 33. The housing 31 is formed of a conductive material, such as brass or copper, and a molybdenum transition member 34 is supported thereon and welded thereto. A silicon wafer 35 having a PN junction therein (not shown) is soldered to the upper surface of the transition member 34 and a tantalum transition member 36 is soldered to the upper surface of the wafer 35. The PN junction extends across the entire cross-sectional area of the wafer 35 and, therefore, a unidirectional impedance is provided between the transition members 34 and 36. A copper terminal plate 37 is bonded to the upper surface of the transition member 36 and a lead 38 is bonded to the central portion of the member 37. In order to seal the wafer 35 and particularly the exposed surface of the PN junction therein from the atmosphere and to preload the wafer 35 by exerting a compressive force between the transition members 34 and 36, a sealing ring 40 which comprises inner and outer metallic rings 41 and 42 and a central glass ring 43 which is seatably connected to the rings 41 and 42 is interconnected between the periphery of the contact member 37 and the top of the housing 31. Preferably, and as shown, the outer ring 42 seats within a rabbet 45 provided in the top of the side wall 33 of the housing 31 and is bonded thereto to provide a fluid tight, rigid connection between the ring 42 and the housing 31. Similarly, the inner ring 41 is bonded to the contact member 37 so as to provide a fluid tight rigid connection between the ring 41 and the member 37.

During the sealing process when the rings 41 and 42 are respectively sealed to the contacting member 37 and to the housing 31, the unit is heated to a temperature exceeding the temperatures encountered during normal use of the diode 30. Therefore, since the housing 31 is formed of copper or brass and thus has a coefficient of expansion greater than the molybdenum, silicon or tantalum, when the unit cools upon completion of the sealing operation, the contraction of the housing 31 exerts a compressive stress on the wafer 35, and the wafer 35 remains under compression during normal use of the rectifier 30.

Inasmuch as a fluid tight seal is provided between the housing 31, contact member 37 and the sealing ring 40, the rubber material used to provide the sealing gasket in the embodiment of Fig. 1 need not be employed. However, where a solder flux is used in making this connection, it has been found desirable to suitably coat the exposed surfaces of the wafer 11 to protect it from this flux. Any suitable material such, for example, as silicon rubber may be used for this purpose. However, it will be noted that in the rectifier 30, the coat 46 need not be held in compression against its supporting components since it is not used to provide the fluid tight seal which is necessary in the rectifier 10.

Figure 3:
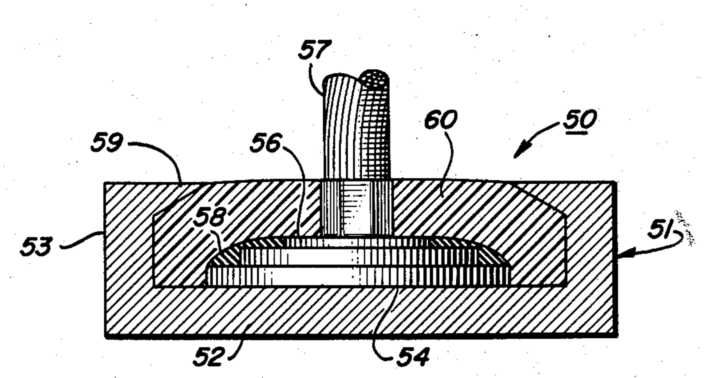
Fig. 3 is a cross-sectional view of still another rectifier embodying the present invention.

Referring now to Fig. 3, there is shown a rectifier 50 embodying the present invention. The rectifier 50 is also of the power rectifier type and comprises a cup-shaped housing member 51 having a circular bottom portion 52 and an upstanding annular side 53. Mounted on the bottom portion 52 within the housing 51 is a molybdenum transition member 54 which is suitably bonded to the housing 51 and on the top of which is disposed a silicon wafer 55 having a PN junction therein. The transition member 54 is connected to the silicon wafer 55 on one side of the junction and a transition member 56 formed of any suitable material such, for example, as tantalum is connected to the silicon 55 on the opposite side of the junction. A lead 57 is centrally mounted on and connected to the transition member 56 whereby a unidirectional impedance is provided between the housing 51 and the lead 57.

In order to provide a fluid tight seal to protect the silicon wafer 55 and particularly the exposed portions of the PN junction therein from the ambient atmosphere, a resilient material 58 which may comprise silicon rubber encloses the exposed surfaces of the silicon wafer 55 and is thus positioned between the transition members 54 and 56. An annular re-entrant flange 59 is provided on the upper end of the housing wall 53 and a rigid imperforate plastic material 60, such, for example, as a thermosetting epoxy resin, fills the remaining space within the housing 51. As the epoxy resin 60 cures a preload compressive force is exerted on the crystal 55.

The present invention thus provides a rectifier construction which is suitable for use in power application and in which the usual resilient or sliding connections between at least one of the terminal members and the crystal wafer is obviated. This novel rectifier construction not only reduces the manufacturing cost of the rectifier and minimizes the size thereof, but, more importantly, it increases the reliability of operation and the life of the rectifier.

While a particular embodiment of the invention has been shown, it will be understood, of course, that the invention is not limited thereto, since many modifications may be made, and it is, therefore, contemplated by the appended claims to cover any such modifications as fall within the true spirit and scope of the invention.

What is claimed as new and is desired to be secured by Letters Patent of the United States is:

1. A diode comprising a semiconductor wafer having a PN junction therein, a terminal member on which said wafer is supported, a resilient member enclosing the surface of said wafer which is intersected by said junction, and a rigid plastic enclosing said resilient member and the remaining exposed portions of said wafer thereby to compress said resilient member against said wafer to provide a fluid tight seal for said junction and to exert a compressive stress on said wafer.

2. A diode as set forth in claim 1 wherein said plastic material is an epoxy resin.

3. A diode comprising a metallic cup-shaped housing, a semiconductor wafer disposed in said housing and supported in the bottom thereof, a terminal connected to the top of said wafer and extending from said housing, and a rigid insulating member interconnected between said housing and the top of said wafer, the coefficient of expansion of said housing exceeding that of said semiconductor wafer and said housing is maintained at a temperature exceeding the normal operating temperature thereof during the connection of said insulating member between said wafer and said housing.

4. A diode comprising a cup-shaped metallic housing having a reentrant flange surrounding the open end thereof, a semiconductor wafer supported within said housing on the bottom thereof, a terminal connected to said wafer and extending from said housing through said open end, and a rigid plastic material filling the remainder of said housing and exerting a compressive force between said housing and said terminal.

5. A diode comprising a cup-shaped housing having a conductive bottom, a conductive terminal and support extending from said bottom into said housing, a semiconductor wafer having a PN junction therein, said wafer being mounted within said housing on said terminal, another terminal connected to said wafer, said terminals being connected to opposite sides of said junction, a rigid plastic enclosing said wafer and portions of said terminals, and said terminal and support including an irregularity in the upstanding sides thereof whereby said plastic exerts a compressive force between said terminals to preload said wafer.

6. A diode as set forth in claim 5 wherein the sides of said housing is made of plastic.

7. A diode as set forth in claim 5 wherein said plastic is a thermosetting resin.

8. A diode comprising a semiconductor wafer having a PN junction therein, a terminal member connected to one side of said wafer, a resilient member enclosing the exposed edges of said junction, and a rigid plastic material enclosing said resilient member thereby to compress said resilient member against said wafer to provide a fluid-tight seal for said junction and to exert a compressive stress on said wafer.

9. A diode as set forth in claim 8, wherein said resilient member is of silicone rubber.

10. A diode as set forth in claim 8, wherein said plastic material is an epoxy resin.

References Cited in the file of this patent

UNITED STATES PATENTS

| | | |
|---|---|---|
| 2,716,722 | Rothstein | Aug. 30, 1955 |
| 2,745,044 | Lingel | May 8, 1956 |
| 2,756,374 | Colleran | July 24, 1956 |
| 2,776,920 | Dunlap | Jan. 8, 1957 |
| 2,829,320 | Dimond | Apr. 1, 1958 |